United States Patent
Marty et al.

(10) Patent No.: US 6,265,275 B1
(45) Date of Patent: Jul. 24, 2001

(54) METHOD OF SELECTIVELY DOPING THE INTRINSIC COLLECTOR OF A VERTICAL BIPOLAR TRANSISTOR WITH EPITAXIAL BASE

(75) Inventors: Michel Marty, St. Paul de Varces; Alain Chantre, Seyssins; Thierry Schwartzmann, Grenoble, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/323,525

(22) Filed: Jun. 1, 1999

(30) Foreign Application Priority Data

Jun. 5, 1998 (FR) .................................................. 98 07060

(51) Int. Cl.[7] .................................................. H01L 21/331
(52) U.S. Cl. .................................................. 438/309; 438/374
(58) Field of Search .................................................. 438/309, 312, 438/320, 370, 373, 374

(56) References Cited

U.S. PATENT DOCUMENTS

| | | | |
|---|---|---|---|
| 5,321,301 | 6/1994 | Sato et al. | 257/592 |
| 5,643,808 | * 7/1997 | Suzuki . | |
| 5,656,514 | 8/1997 | Ahlgren et al. | 438/320 |

FOREIGN PATENT DOCUMENTS

| | | | |
|---|---|---|---|
| 196 43 903 A 1 | 6/1997 | (DE) | 21/331 |
| 0 762 511 A 1 | 3/1997 | (EP) | 29/8 |
| 0 795 899 A1 | 9/1997 | (EP) | 21/331 |

OTHER PUBLICATIONS

Ren et al, *Silicon Nitride as Dielectric in the Low Temperature SiGe HBT Processing*, Jun. 1997, vol. 36 No. 1–4, p. 179–182, p. 180; figure 1.

Burghartz et al, *An Ultra Low Thermal–Budget Sige–Base Bipolar Technology*, May 17, 1993, Digest of Technical Papers of the Symposium on VLSI Technology, Kyoto p. 59/60, Institute of Electrical and Electronics Engineers figure 1.

* cited by examiner

*Primary Examiner*—Tuan H. Nguyen
(74) *Attorney, Agent, or Firm*—Theodore E. Galanthay; Allen, Dyer, Doppelt Milbrath & Gilchrist, P.A.

(57) ABSTRACT

The collector of a vertical bipolar transistor is selectively doped by a first implantation of dopants before the epitaxy of the base, and is selectivly doped by a second implantation of dopants through the epitaxial base. Two implanted zones with different widths are obtained. The base of the vertical bipolar transistor is thinned and the collector resistance is optimized.

11 Claims, 4 Drawing Sheets

METHOD OF SELECTIVELY DOPING THE INTRINSIC COLLECTOR OF A VERTICAL BIPOLAR TRANSISTOR WITH EPITAXIAL BASE

RELATED APPLICATIONS

This application is related to: application entitled "VERTICAL BIPOLAR TRANSISTOR INCLUDING AN EXTRINSIC BASE WITH REDUCED ROUGHNESS, AND FABRICATION PROCESS", U.S. application Ser. No. 09/323,357; and U.S. Pat. No. 6,177,717 entitled "LOW-NOISE VERTICAL BIPOLAR TRANSISTOR AND CORRESPONDING FABRICATION PROCESS", which were concurrently filed with the present application.

FIELD OF THE INVENTION

The invention relates to the field of semiconductor devices, and, more particularly, to a transistor.

BACKGROUND OF THE INVENTION

The application titled "Low-Noise Vertical Bipolar Transistor and Corresponding Fabrication Process" discloses a method for producing a vertical bipolar transistor with a silicon/germanium heterojunction base and an epitaxial emitter on the upper surface of the base. During production of such a transistor, a region of the intrinsic collector lying under the emitter window is selectively doped to increase the speed of the transistor. In other words, the value of its transition frequency, i.e., cutoff frequency for the current gain, and the value of its maximum oscillation frequency, i.e., cutoff frequency for the power gain, are increased.

This selective doping is preferably carried out on two successive phosphorus implantations through the heterojunction base, which has been epitaxially grown beforehand on the surface of the intrinsic collector. For these implantations, use is made of the resin block which was used for etching the emitter window to obtain implantation of the overdosed zone of the collector, which is aligned with the emitter window.

However, implanting through the base creates defects in it which will cause diffusion of the boron in the base. The extent of this will become greater as the dopant dose implanted in the intrinsic collector increases. Lastly, implanting through the base leads to broadening of the base, which causes a reduction in the speed of the transistor. Furthermore, the defects actively contribute to relaxing the SiGe layer, which generates dislocations, thus short-circuiting the junctions of the transistor.

SUMMARY OF THE INVENTION

An object of the present invention is to increase the speed of vertical bipolar transistors.

A further object of the invention is to optimize the value of the collector resistance while avoiding an excessive increase in the collector/base capacitance.

A vertical bipolar transistor includes a silicon-germanium heterojunction base, and is intended to be integrated in high-frequency technologies with very large scale integration (VLSI). The intrinsic collector of such a transistor is selectively overdoped with silicon/germanium (SiGe) in the heterojunction epitaxial base.

A method for selectively doping the intrinsic collector of a vertical bipolar transistor with a silicon/germanium heterojunction includes the step of producing the intrinsic collector by epitaxy or implantation on an extrinsic collector layer buried in a semiconductor substrate. The method further includes the step of producing a side insulation region surrounding the upper part of the intrinsic collector and an offset extrinsic collector well. A silicon/germanium heterojunction base is produced lying above the intrinsic collector and the side insulation region including nonselective epitaxy of a stack of layers of silicon and silicon/germanium, e.g., a stack of one SiGe layer encapsulated by two silicon layers. A first implantation of dopants is provided in the intrinsic collector, which is carried out through a first implantation window before the nonselective epitaxy is formed above the intrinsic collector.

A second implantation of dopants in the intrinsic collector with a lower implantation dose and lower energy than the first implantation is performed through the epitaxially grown stack via a second implantation window lying inside the first window formed above the stack and self-aligned with the emitter. This self-alignment of the second implantation with the emitter, in particular, is produced by using the definition mask of the emitter window as the implantation mask for the second implantation. The second implantation window is then the same size as the emitter window.

In other words, a first implantation of dopants in the intrinsic collector is carried out before the formation of the stack within which the intrinsic base is produced. This implantation is high-energy implantation. A second implantation of dopants in the intrinsic collector is then carried out through the epitaxial base. This second implantation has an implantation dose lower than the implantation dose of the first, which is typically by a factor of 10. Therefore, this results in a much lower level of defects in the stack, which leads to obtaining a thinner intrinsic base and consequently an increase in the speed of the transistor.

Furthermore, making two separate implantations of dopants in the intrinsic collector makes it possible to adjust the width of the first implantation window independently of the width of the second implantation window. Although the two implantation windows could be chosen with the same size, it is particularly advantageous to choose a first implantation window which is wider than the second to be able to widen the first overdoped zone implanted in the collector, and thus to be able to reduce the collector resistance. In the case in which this first implantation window is widened, a person skilled in the art will thus be readily able to adjust the implantation dose and the implantation energy of this first implantation to avoid an excessive dopant rise in the silicon. Consequently, this avoids an excessive increase in the collector/base capacitance.

According to one approach of the method, in which the step of producing the base includes, before forming the epitaxial grown stack, the opening of a base window is formed over the intrinsic collector in a protection layer, e.g., amorphous silicon. This base window extends over the side insulation region. A specific implantation mask, whose first implantation window is wider than the second implantation window, but less wide than the base window, is used for the first implantation of dopants in the intrinsic collector.

As a variation, the mask for etching the base window may be used for the first implantation of the dopants. The first implantation window is then identical in size to the base window. This makes it possible to save on one mask and to obtain an overdoped lower zone of the collector extending over the entire width of the active zone, which leads to a yet further reduction in the collector resistance.

BRIEF DESCRIPTION OF THE DRAWINGS

Other advantages and characteristics of the invention will become apparent on reading the detailed description of an entirely nonlimiting embodiment and the appended drawings, in which.

DETAILED DESCRIPTION OF THE PREFERRED EMBODIMENTS

Figure 1:
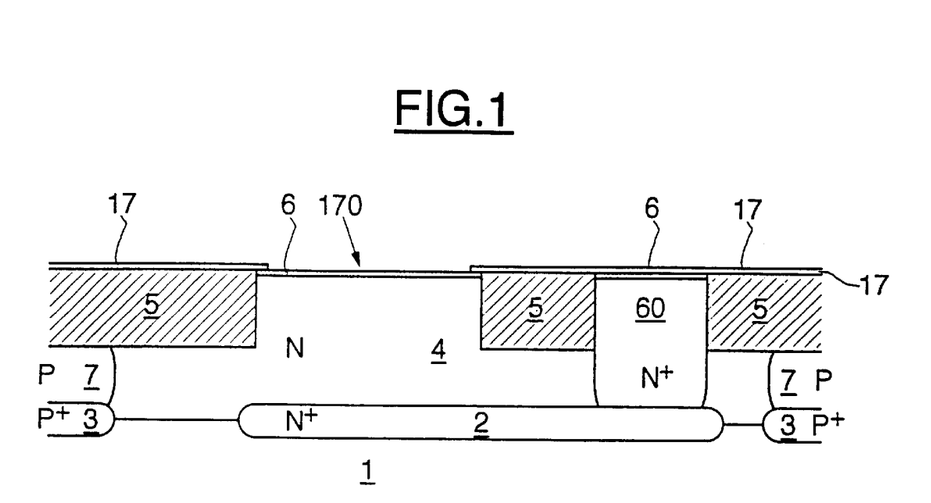
FIGS. 1–7 illustrate a first embodiment of the method for obtaining an overdosed intrinsic collector zone wider in its lower part than in its upper part, according to the present invention.

In FIG. 1, reference 1 denotes a silicon substrate, for example a P type, on the surface of which an $N^+$ doped extrinsic collector buried layer 2 is produced in a way which is conventional and well known by one skilled in the art using arsenic implantation. Similarly, two $P^+$ doped buried layers 3 are conventionally produced on either side of the extrinsic collector 2 by boron implantation.

Thick epitaxy, readily known by one skilled in the art, is carried out on the substrate 1 thus formed to produce an N type monocrystalline silicon layer 4 having a thickness typically on the order of 1 micron. A side insulation region 5 is then produced in this layer 4 in a way which is readily known by one skilled in the art, either by a local oxidation (LOCOS) method or by a shallow trench type method. For simplicity, FIG. 1 represents a side insulation region 5 of the shallow trench type method.

An $N^+$ doped collector well 60 making contact with the buried layer 2 is also produced in a conventional way, such as by phosphorus implantation. Boron implantations are then carried out to produce P doped well areas 7 under the side insulation regions 5. This provides insulation from the transistors adjacent to the bipolar transistor being described herein.

A thermal oxide layer 6, typically silicon dioxide, is then grown in a conventional way on the surface of the epitaxial monocrystalline intrinsic collector 4. This growth of silicon dioxide also takes place over the entire wafer, and, in particular, on the collector well 60. This oxide layer 6 also forms the gate oxide for complementary field-effect transistors with insulated gates (CMOS transistors) produced in conjunction with the bipolar transistor on the same wafer (BiCMOS technology, bipolar CMOS).

A layer 17 formed by amorphous silicon and having a thickness of 500 Å is then deposited on the semiconductor unit thus formed. Next, by plasma etching with termination on the oxide layer 6, a base window 170 is etched using a mask and a resin block, which is not represented in FIG. 1. In the case in which the side insulation 5 is produced by the shallow trench type method, the two parts of the etched silicon layer 17 protrude slightly above the intrinsic collector 4. In the case in which the side insulation 5 is produced by the LOCOS method, the etching window 170 may be wider than the intrinsic collector 4.

Figure 2:
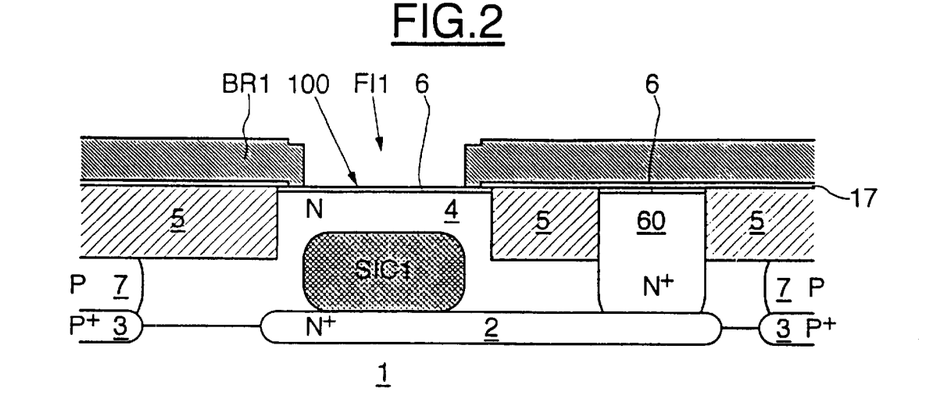

Using a mask, a resin block BR1 is produced on the semiconductor unit as shown in FIG. 2. The mask includes a cavity above the intrinsic collector and corresponds to a first implantation window FI1. A first implantation of dopants (phosphorus) is then carried out in the intrinsic collector through the oxide layer 6 to produce a first overdoped zone SIC1 in the collector. The implantation dose of this first implantation is, for example, on the order of or in excess of $10^{13}$ at/cm$^2$, and the energy is on the order of 200 to 300 keV.

Figure 3:
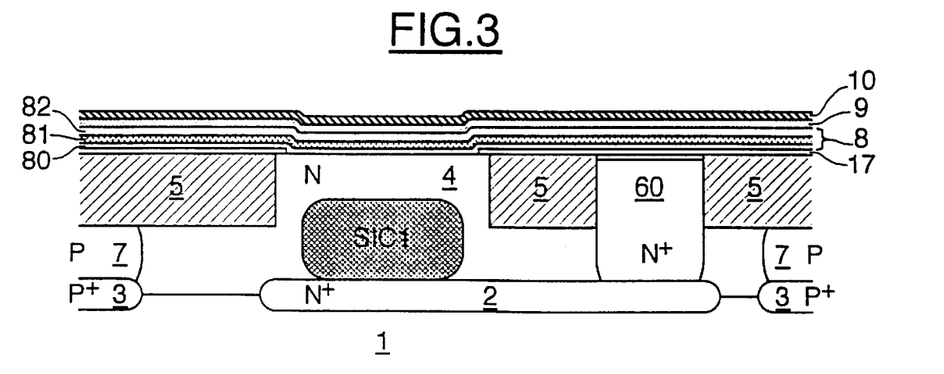

Referring next to FIG. 3, chemical deoxidation of the oxide layer 6 lying above the collector is carried out. One of the functions of the amorphous silicon layer 17 is to protect the rest of the wafer during chemical deoxidation, and, in particular, the side insulation regions 5 when formed by the shallow trench type method.

Next, following a treatment involving the desorption of the base window under hydrogen at a temperature in excess of 600° C., a stack 8 of three layers 80, 81 and 82, within which the base of the transistor will be produced, is then epitaxially grown. More precisely, a first layer of undoped silicon 80 is epitaxially grown over a thickness of a few tens of nanometers. The second layer 81, formed by silicon/germanium, is then grown epitaxially. This second layer is formed by a first sublayer of $Si_{1-x}Ge_x$, with x being a constant between 0.1 and 0.2, on top of which there is a second sublayer, also formed by an $Si_{1-x}Ge_x$ alloy, with x decreasing to 0, for example, and P doped with boron. The total thickness of the layer 81 is moderate, typically from 20 to 100 nm.

An epitaxial layer 82, having a thickness of a few tens of nanometers and made of silicon P doped using boron, is then placed on top of the second sublayer of the layer 81. At the end of this epitaxy, typically carried out at 700° C. in an ultraclean CVD reactor, a stack of monocrystalline layers is then obtained on the intrinsic collector in the base window, and polycrystalline ones above the amorphous silicon layers 17. This stack of layers makes it possible to form a silicon/germanium heterojunction base. The epitaxy for producing the heterojunction base is nonselective epitaxy.

Furthermore, the presence of the amorphous silicon layer 17 makes it possible to form a surface essentially formed by silicon at the start of the epitaxy, which allows a substantially identical growth rate to be obtained on the intrinsic collector and on the amorphous silicon. This leads to better uniformity in terms of the thickness of the base being obtained. Next, a first layer of silicon dioxide having a thickness of the order of 200 Å is deposited on the layer 81. A second layer 10 of silicon nitride ($Si_3N_4$), having a thickness of 300 Å, is also deposited on the first silicon dioxide layer 9.

Figure 4:
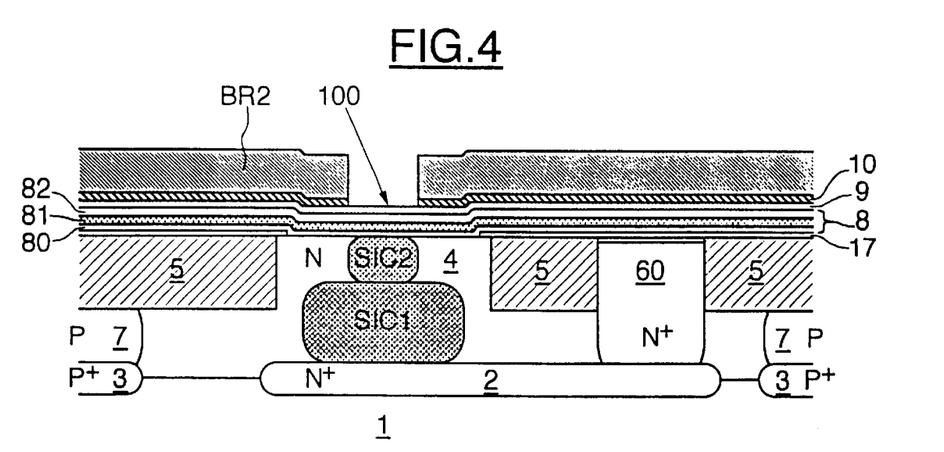

Referring to FIG. 4 next, a zone 100 in the nitride layer 10 corresponding to an emitter window lying above the intrinsic collector 4 is defined with the aid of a mask. Plasma etching of the nitride layer 10 with termination on the silicon dioxide layer 9 is then carried out in the conventional way with the aid of a resin layer BR2 corresponding to the mask to expose the zone 100. Next, keeping the resin that is present on the layer 10 and has been used in etching the latter, a second implantation of phosphorus is carried out through the stack 8 to produce a second overdoped zone SIC2 in the intrinsic collector. The second implantation, for example, is on the order of $10^{12}$ atoms/cm$^2$ with an energy on the order of or in excess of 100 keV.

Figure 5:
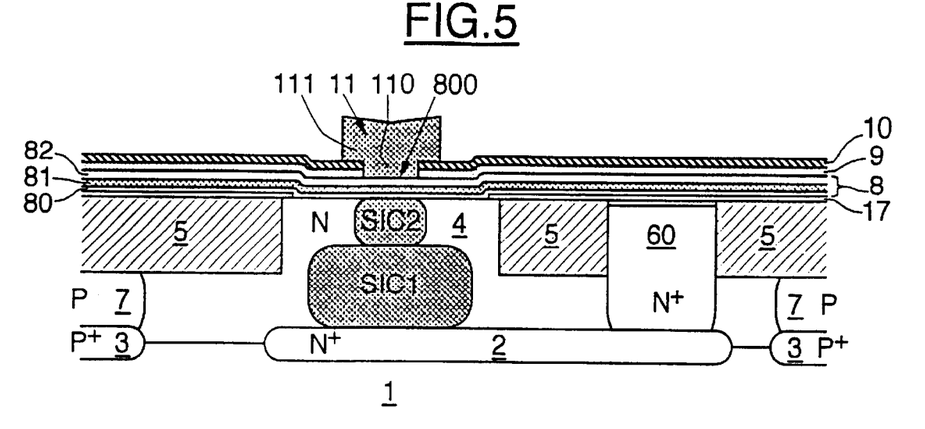

At the end of this step, the resin present on the silicon nitride layer 10 is removed and a chemical deoxidation treatment is carried out to remove the part of the silicon dioxide layer 8 lying in the zone 100, and thus to produce the emitter window 800, as shown in FIG. 5. The second implantation window 100, used for the second implantation of dopants, is therefore identical to the emitter window. This ensures self-alignment of the zone SIC2 relative to the emitter window and therefore relative to the emitter.

An example of a chemical deoxidation treatment includes using an acid bath based on hydrofluoric acid diluted to about 1% for one minute. This makes it possible to obtain a monocrystalline silicon surface which is chemically clean, i.e., the concentration of oxygen atoms is less than $10^{15}/cm^2$. Furthermore, such chemical deoxidation does not degrade the underlying monocrystalline silicon surface, unlike plasma etching, for example. Consequently, the chemical deoxidation does not introduce crystal defects.

To further enhance the surface condition of the silicon, a desorption treatment under hydrogen at high temperature (>550° C.) is advantageously carried out to eliminate the residual impurities adsorbed on the surface of the silicon during the deoxidation. Next, the emitter of the transistor is produced in an ultraclean CVD reactor, such as the one sold by Applied Materials under the reference CENTURA HTF. More precisely, the semiconductor unit, with the base uncovered in the emitter window 800, is exposed to a silane and arsine gas mixture in a non-oxidizing atmosphere, typically under vacuum or under hydrogen.

The CVD conditions are, for example, a flow rate equal to 10 litres of hydrogen/min, a flow rate equal to 0.5 litre of silane/min, and a flow rate equal to $0.12 \ cm^3$ of arsine/min at 630° C. and under a pressure of 80 torr. A person skilled in the art will readily recognize that these conditions correspond to polysilicon deposition. However, because of the chemically clean nature of the monocrystalline surface of the base uncovered in the window 800, the silicon deposited in this reactor grows epitaxially, i.e., it is grown in monocrystalline form on the base.

After a silicon layer having a thickness on the order of 2500 Å has been obtained, etching of the silicon layer is carried out in a conventional way using a new photolithography mask, as well as a corresponding resin block, to obtain an emitter 11 as shown in FIG. 5. The emitter 11 which, in the window 800, has a lower part 110 on top of which there is an upper part 111 wider than the emitter window. The distance between the edge of the emitter window and the edge of the region 111 typically is on the order of 0.2 $\mu$m. Therefore, this emitter has been doped in situ and is monocrystalline, at least in the vicinity of the interface with the base in the emitter window.

Figure 6:
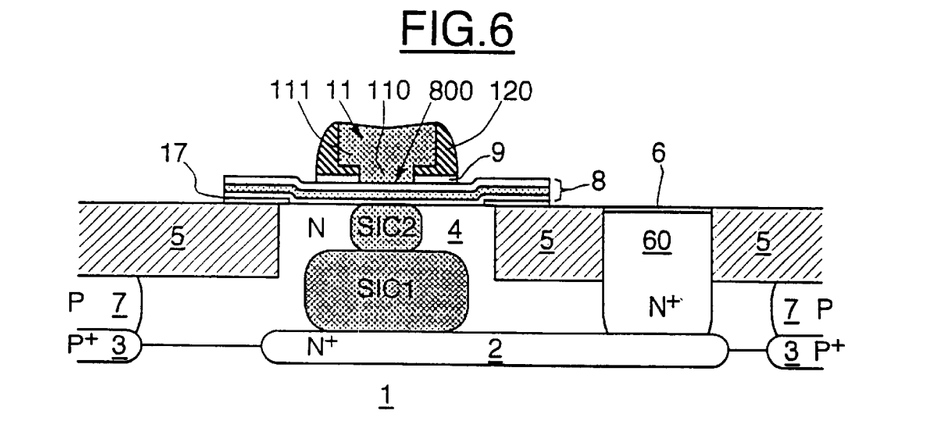

Deposition of a silicon nitride layer is then carried out, and this is etched to obtain spacers 120, which includes the $Si_3N_4$ layer 10 and appears on the vertical walls of the upper region 111 of the emitter and on the silicon dioxide layer 9. The geometry of the base of the transistor is then defined with the aid of a new mask. After the oxide layer 9 has been etched beforehand, etching of the stack of layers 17 and 8 is carried out to obtain the configuration illustrated in FIG. 6.

Figure 7:
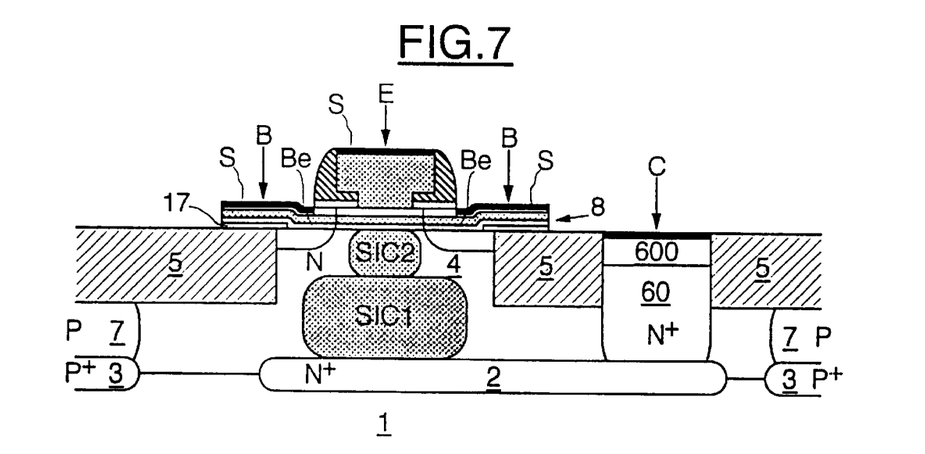

A resin block is then deposited on either side of the base, and a smaller amount of resin is deposited above the emitter. Then P+implantation of the stack 8 is carried out with the aid of boron to define the extrinsic base Be, as shown in FIG. 7. Next, after the transistor has been protected with the resin, implantation of arsenic is carried out to produce an $N^+$ implanted zone referenced 600 on the surface of the collector well.

The final step produces the base, emitter and collector metallizations S by a known technique of the self-aligned silicide type. This technique includes deposition a layer of metal, e.g., titanium, to form a silicide ($TiSi_2$) on the silicon zones of the extrinsic base, of the emitter and of the extrinsic collector. The transistor according to the present invention, as illustrated in FIG. 7, is therefore an n-p-n vertical bipolar transistor with a thinned silicon/germanium heterojunction base which can be used in a BiCMOS technology of the VLSI type.

Figure 8:
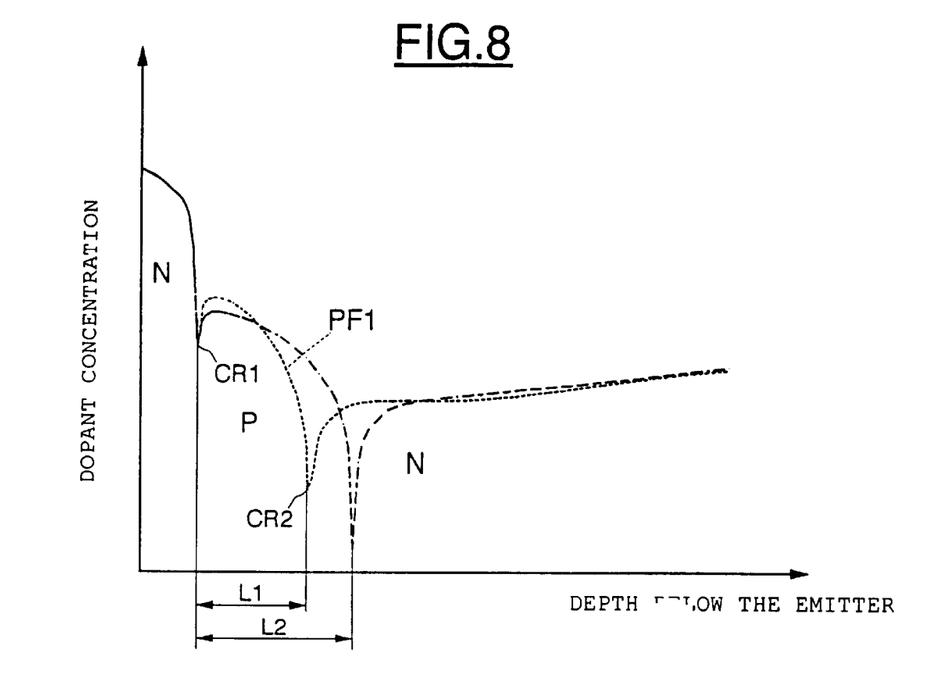
FIG. 8 illustrates a comparison between a doping profile of a transistor obtained according to the present invention and a doping profile of a transistor in which selective doping of the intrinsic collector has been carried out entirely through the epitaxial base.
Figure 9:
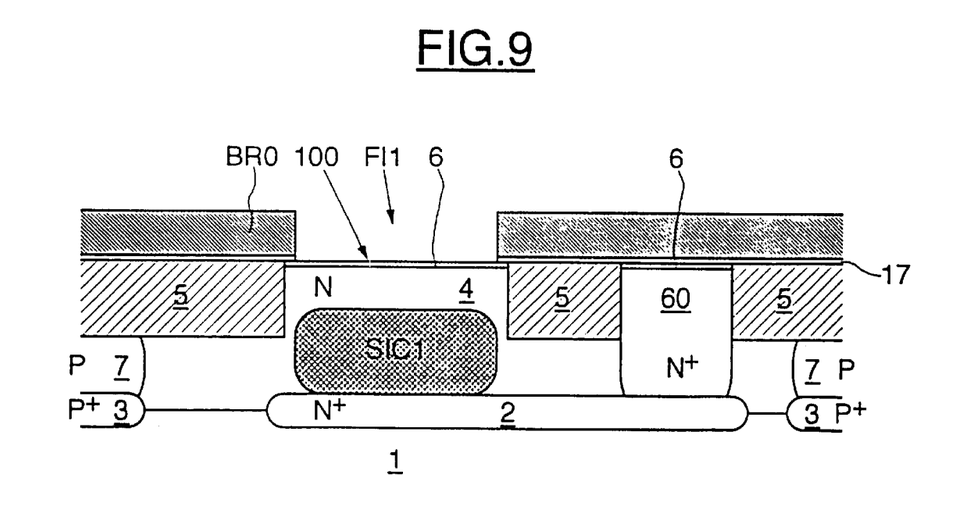
FIG. 9 illustrates another approach for obtaining an overdoped lower intrinsic collector zone having the full width of the active zone, according to the present invention.

An example of the doping profile for the transistor is illustrated in FIG. 8 by dots. This profile PF1 has a first dip CR1 level with the emitter/base junction which lies in the bottom part of the layer 82. This profile also includes a second dip CR2 level with the base/collector junction which lies in the bottom part of the lower sublayer ($Si_{1-x}Ge_x$, with x=0.12) of the layer 81. The distance L1 between the dips CR1 and CR2 represent the width of the intrinsic base.

A person skilled in the art will readily recognize that the width LI is smaller than the width L2 of the base obtained by a doping profile which has a similar shape, represented in dashes, and corresponds to two dopant implantations, both carried out through the epitaxial stack 80–82. Further, the doping level of the base is heavier with the method according to the invention. In addition, the collector resistance is reduced when the zone SIC2 is wider than the zone SIC1.

Besides these characteristics, the transistor illustrated in FIG. 7 includes a monocrystalline emitter in contact with the silicon of the base. This results in reduced low-frequency noise, with good static parameters, and in particular, the current gain. This is by virtue of the presence of the SiGe heterojunction base which compensates for the disappearance of the interface oxide present in the polysilicon emitters. Finally, the emitter resistance is reduced relative to a transistor with polycrystalline (polysilicon) emitter.

It is also particularly advantageous, when the emitter doped in situ is being produced, to adjust the amount of dopant gas as the epitaxy of the emitter proceeds. Thus, at the start of the epitaxy, the arsine flow rate above 0.12 $cm^3/min$ will, for example, be kept while, in the upper region of the emitter, this flow rate will be reduced, for example, down to a value of 0.6 $cm^3/min$. Therefore, for an emitter doped in situ, a concentration of As dopant, for example, equal to $3 \ 10^{20}/cm^3$ in the lower region of the emitter in contact with the base, and a concentration of As dopant, for example, equal to $10^{20}/cm^3$ in the upper region of the emitter, will finally be obtained. These values therefore make it possible to obtain both good electron injection into the lower part of the emitter and good siliciding above the upper part of the emitter.

The method according to the present invention is nevertheless not limited to a vertical bipolar transistor having an epitaxial emitter. It is generally applicable to any type of vertical bipolar transistor, and in particular also to those having a polycrystalline (polysilicon) emitter, in which the emitter results from the deposition of polysilicon which may be produced doped in situ in a chemical vapour deposition reactor and includes an oxide layer present at the emitter/base (emitter/stack 8) interface. Furthermore, the amorphous silicon layer 17 could also be replaced by a layer of silicon nitride ($Si_3N_4$), which would provide a lower degree of roughness on the surface of the extrinsic base. Lastly, the method can be applied to any type of epitaxial base, in particular, an entirely silicon base whose stack 8 would then be reduced to a single silicon layer.

What is claimed is:
1. A method for making a selectively doped intrinsic collector of a vertical bipolar transistor comprising an extrinsic collector layer, an offset extrinsic collector well, an emitter and a base, the method comprising:

forming an intrinsic collector on the extrinsic collector layer buried in a semiconductor substrate;

forming a side insulation region surrounding an upper part of the intrinsic collector and the offset extrinsic collector well; and forming a silicon/germanium heterojunction base above the intrinsic collector and the side insulation region by performing a first implantation of dopants in the intrinsic collector through a first implantation window formed above the intrinsic collector, nonselectively epitaxially growing a stack of layers including silicon and silicon/germanium above the first implantation window, the side insulation region and the offset extrinsic collector well, and performing a second implantation of dopants in the intrinsic collector with a lower energy and lower implantation dose through the epitaxially grown stack through a second implantation window lying inside the first implantation window formed above the stack and self-aligned with the emitter.

2. A method according to claim 1, wherein forming a nonselective epitaxially grown stack further comprises defining an emitter window for the emitter using a mask, and using the mask as an implantation mask for the second implantation window so that the second implantation is a same size as the emitter window.

3. A method according to claim 2, wherein forming the heterojunction base further comprises opening a base window over the intrinsic collector in a protection layer extending over the side insulation region before forming the nonselective epitaxially grown stack, and using a mask having a first implantation window wider than the second implantation window and less wide than the base window.

4. A method according to claim 2, wherein forming the heterojunction base further comprises opening a base window over the intrinsic collector in a protection layer extending over the side insulation region using a mask before forming the nonselective epitaxially grown stack, and using the mask for etching the first implantation window so that the first implantation window is identical in size to the base window.

5. A method for making a vertical bipolar transistor, the method comprising:

forming an intrinsic collector on an extrinsic collector layer buried in a semiconductor substrate and adjacent an offset extrinsic collector well in the semiconductor substrate;

forming a side insulation region surrounding an upper part of the intrinsic collector and the offset extrinsic collector well; and forming a heterojunction base above the intrinsic collector and the side insulation region by performing a first implantation of dopants in the intrinsic collector through a first implantation window formed above the intrinsic collector, epitaxially growing a stack comprising a plurality of layers above the first implantation window, the side insulation region and the offset extrinsic collector well, and performing a second implantation of dopants in the intrinsic collector with a lower energy and lower implantation dose through the epitaxially grown stack through a second implantation window lying inside the first implantation window formed above the stack and self-aligned with an emitter.

6. A method according to claim 2, wherein the heterojunction base comprises silicon/germanium.

7. A method according to claim 6, wherein forming the heterojunction base further comprises opening a base window over the intrinsic collector in a protection layer extending over the side insulation region before forming the epitaxially grown stack, and using a mask having a first implantation window wider than the second implantation window and less wide than the base window.

8. A method according to claim 6, wherein forming the heterojunction base further comprises opening a base window over the intrinsic collector in a protection layer extending over the side insulation region using a mask before forming the epitaxially grown stack, and using the mask for etching the first implantation window so that the first implantation window is identical in size to the base window.

9. A method according to claim 5, wherein forming an epitaxially grown stack is nonselective.

10. A method according to claim 5, wherein forming an epitaxially grown stack comprises forming silicon and silicon/germanium layers.

11. A method according to claim 5, wherein epitaxially growing a stack further comprises defining an emitter window for the emitter using a mask, and using the mask as an implantation mask for the second implantation window so that the second implantation window is a same size as the emitter window.

* * * * *

UNITED STATES PATENT AND TRADEMARK OFFICE
CERTIFICATE OF CORRECTION

PATENT NO. : 6,265,275 B1
DATED : July 24, 2001
INVENTOR(S) : Marty et al.

It is certified that error appears in the above-identified patent and that said Letters Patent is hereby corrected as shown below:

<u>Title page,</u>
Item [73], Assignee: "STMicroelectronics, S.A., Gentilly (FR)" insert
-- ; Commissariat à l'Energie Atomique; Paris, France --

Signed and Sealed this

Tenth Day of September, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

| | | |
|---|---|---|
| PATENT NO. | : 6,265,275 B1 | Page 1 of 1 |
| DATED | : July 24, 2001 | |
| INVENTOR(S) | : Michel Marty, Alain Chantre and Thierry Schwartzmann | |

It is certified that error appears in the above-identified patent and that said Letters Patent is hereby corrected as shown below:

Column 1,
Line 40, delete "overdosed" and insert -- overdoped --

Column 3,
Line 4, delete "overdosed" and insert -- overdoped --

Column 8,
Line 18, delete "claim 2" and insert -- claim 5 --

Signed and Sealed this

Twenty-first Day of September, 2004

JON W. DUDAS
*Director of the United States Patent and Trademark Office*